(12) United States Patent
Chen et al.

(10) Patent No.: US 6,924,517 B2
(45) Date of Patent: Aug. 2, 2005

(54) THIN CHANNEL FET WITH RECESSED SOURCE/DRAINS AND EXTENSIONS

(75) Inventors: Huajie Chen, Danbury, CT (US); Bruce B. Doris, Brewster, NY (US); Philip J. Oldiges, La Grangeville, NY (US); Xinlin Wang, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,907

(22) Filed: Aug. 26, 2003

(65) Prior Publication Data

US 2005/0045947 A1 Mar. 3, 2005

(51) Int. Cl.⁷ .................. H01L 29/786; H01L 21/336
(52) U.S. Cl. .................. 257/213; 257/347; 438/164
(58) Field of Search .................. 257/213, 347, 257/330–333, 336, 359, 408; 438/197, 589, 164

(56) References Cited

U.S. PATENT DOCUMENTS

| | | | |
|---|---|---|---|
| 4,343,015 A | 8/1982 | Baliga et al. | |
| 5,218,571 A | 6/1993 | Norris | |
| 5,280,446 A | 1/1994 | Ma et al. | |
| 5,635,736 A | 6/1997 | Funaki et al. | |
| 5,638,320 A | 6/1997 | Wong et al. | |
| 5,687,115 A | 11/1997 | Wong et al. | |
| 5,694,356 A | 12/1997 | Wong et al. | |
| 5,719,427 A | 2/1998 | Tong et al. | |
| 5,751,635 A | 5/1998 | Wong et al. | |
| 5,757,047 A | 5/1998 | Nakamura | |
| 5,780,889 A | 7/1998 | Sethi | |
| 5,798,291 A | 8/1998 | Lee et al. | |
| 5,933,736 A | 8/1999 | Nakamura | |
| 5,970,329 A | 10/1999 | Cha | |
| 6,248,169 B1 | 6/2001 | Juang et al. | |
| 6,271,094 B1 * | 8/2001 | Boyd et al. | 438/287 |
| 6,380,010 B2 * | 4/2002 | Brigham et al. | 438/161 |
| 6,380,088 B1 | 4/2002 | Chan et al. | |
| 6,420,218 B1 | 7/2002 | Yu | |
| 6,437,404 B1 | 8/2002 | Xiang et al. | |
| 6,531,347 B1 * | 3/2003 | Huster et al. | 438/164 |
| 6,541,814 B1 | 4/2003 | Cao et al. | |
| 6,743,680 B1 * | 6/2004 | Yu | 438/285 |
| 2004/0007724 A1 * | 1/2004 | Murthy et al. | 257/288 |
| 2005/0003627 A1 * | 1/2005 | Abbott et al. | 438/404 |

OTHER PUBLICATIONS

Peter Van Zant, Microchip Fabrication, 2000, McGraw–Hill, p. 37.*

* cited by examiner

*Primary Examiner*—Mary Wilczewski
*Assistant Examiner*—Monica Lewis
(74) *Attorney, Agent, or Firm*—Charles W. Peterson, Jr.; H. Daniel Schurmann (57) ABSTRACT

A field effect transistor (FET), integrated circuit (IC) chip including the FETs and a method of forming the FETS. The devices have a thin channel, e.g., an ultra-thin (smaller than or equal to 10 nanometers (10 nm)) silicon on insulator (SOI) layer. Source/drain regions are located in recesses at either end of the thin channel and are substantially thicker (e.g., 30 nm) than the thin channel. Source/drain extensions and corresponding source/drain regions are self aligned to the FET gate and thin channel.

28 Claims, 8 Drawing Sheets

THIN CHANNEL FET WITH RECESSED SOURCE/DRAINS AND EXTENSIONS

BACKGROUND OF INVENTION

The present invention is related to semiconductor devices and manufacturing and more particularly to high performance field effect transistors (FETS) and methods of manufacturing high performance FETS.

Typical semiconductor integrated circuit (IC) design goals include high performance and density at minimum power. To minimize semiconductor circuit power consumption, most ICs are made in the well-known complementary insulated gate field effect transistor (FET) technology known as CMOS. A typical CMOS circuit drives a purely or nearly pure capacitive load and includes paired complementary devices, i.e., an n-type FET (NFET) paired with a corresponding p-type FET (PFET), usually gated by the same signal. Performance depends upon how fast the CMOS circuit can charge and discharge the capacitive load, i.e., the circuit's switching speed. Since the pair of devices have operating characteristics that are, essentially, opposite each other, when one device (e.g., the NFET) is on and conducting (modeled simply as a closed switch), the other device (the PFET) is off, not conducting (ideally modeled as a simple open switch) and, vice versa. Thus, ideally, there is no static or DC current path in a typical CMOS circuit and the circuit load switches as fast as one switch can be closed and the other opened.

A CMOS inverter, for example, is a PFET and NFET pair that are series connected between a power supply voltage ($V_{dd}$) and ground (GND). Both are gated by the same input and both drive the same a capacitive load. At one input signal state the PFET is on pulling the output high, PFET on current charging the load capacitance to $V_{dd}$. At the opposite input signal state the NFET is on pulling the output low, NFET on current discharging the load capacitance back to ground. Device on current is related to gate, source and drain voltages and, depending upon those voltages, the device may be modeled as a voltage controlled current source or a resistor. Since series resistance, i.e., in the device drain or source, drops some voltage as current flows through the device, series resistances affect device voltages and so, affect (reduce) device current, slowing the charge or discharge of the capacitive load. The switch is open, i.e., the device is off, when the magnitude of the gate to source voltage ($V_{gs}$) is less than some threshold voltage ($V_T$) with respect to its source. So, ideally, an NFET is off below $V_T$, and on, conducting current above $V_T$. Similarly, a PFET is off when its gate is above its $V_T$, i.e., less negative, and on below $V_T$.

Semiconductor technology and chip manufacturing advances towards higher circuit switching frequency (circuit performance) and an increased number of transistors (circuit density) for more function from the same area have resulted in a steadily decreasing chip feature size and, correspondingly, supply voltage. Generally, all other factors being constant, the active power consumed by a given unit increases linearly with switching frequency. Thus, not withstanding the decrease of chip supply voltage, chip power consumption has increased as well. Both at the chip and system levels, cooling and packaging costs have escalated as a natural result of this increase in chip power.

Unfortunately, as FET features have shrunk, device leakages including gate leakages (i.e., gate to channel, gate to source or drain and gate induced drain leakage (GIDL)) and source/drain junction leakages have become pronounced. Collectively, these leakages are included in what is known as sort channel effects. In well known bulk technologies, for example, short channel effects occur, in part, because dopant implanted in the device source/drain regions out-diffuses radially, such that source/drain regions extended below the device channels. This resulted in a buried leakage path between the source/drain regions and, in some cases in sub-surface channel shorts. Other leakage sources arise, for example, as the distance is reduced between the source and drain junction barrier layers, i.e., from reverse biased junctions. Typically, sub-threshold effects include what is known as subthreshold leakage current, i.e., current flowing drain to source ($I_{ds}$) at gate biases below threshold for NFETs and above for PFETs. Further, for a particular device, subthreshold current increases with the magnitude of the device's drain to source voltage ($V_{ds}$) and inversely with the magnitude of the device's $V_T$, drain induced barrier lowering. In addition to the leakage, short channel effects also include what is known as $V_T$ roll-off, where the short channel device's current-voltage (I–V) curve exhibits degraded definition.

Lightly doped drains (LDD) are one approach to reducing short channel problems. Essentially, spacers are formed alongside FET gates at source/drain regions. The spacer blocks or attenuates implanting dopant at the gates, spacing the source/drain diffusions away from the gate. A lightly doped region, typically implanted prior to spacer formation, is formed between the heavier source/drain regions and the gate to complete the device. Unfortunately, these lightly doped regions add series resistance at the source and drain of each device, which reduces device currents and degrades circuit performance. Furthermore, as device channel lengths have shrunk well below one micron (1 μm), subthreshold problems have become more pronounced and lightly doped drains does not solve those problems.

Short channel effects improve inversely with body thickness. So, sub-threshold leakage and other short channel effects have been controlled and reduced in silicon on insulator (SOI), by thinning the surface silicon layer, i.e., the device layer. In what is commonly referred fully depleted (FD) SOI on an ultra-thin SOI wafer, the silicon layer is less than 50 nm. Ultra-thin SOI is the leading candidate to continue scaling gate to deep sub 40 nm and beyond. Ultra-thin SOI devices operate at lower effective voltage fields. As a result, the devices can be doped for higher mobility, which in turn increases device current and improves performance. Also, ultra-thin SOI devices have a steeper subthreshold current swing with current falling off sharply as $V_{gs}$ drops below $V_T$. Unfortunately, however, because source/drain regions are made from the same ultra-thin SOI layer, devices have higher external resistance.

So, to reduce this ultra-thin SOI device external resistance, the semiconductor surface layer is selectively thickened, e.g., using selective epitaxial silicon growth, to produce raised source and drain (RSD) regions. The raised source/drain regions have a larger cross-sectional area and so, lower resistance per unit area (sheet resistance) and so, are effective in overcoming the external resistance problem. Unfortunately, raised source/drains above the silicon layer surface places parallel surface areas at each side of the gate, requiring gaps at gate sidewalls (e.g., spacers) to prevent shorts and, simultaneously causing increased parasitic gate capacitance between the gate and the RSD regions. For example, 30 nanometer (30 nm) RSD regions may increase overlap capacitance for an ultra-thin (~10 nm) FET with 10 nm sidewall spacers as much as 25 50% (0.08 0.2 femto- Farads (fF) per micron of width) depending upon spacer material. Further, the sidewall spacers add to device area, preventing RSD regions from being placed at the channel ends. Thus, RSD requires a trade-off between reducing external resistance and accepting increased parasitic capacitance.

Both U.S. Pat. No. 6,420,218 B1 to Yu, entitled "Ultra-Thin Body SOI MOS Transistors Having Recessed Source And Drain Regions" and U.S. Pat. No. 6,437,404 B1 to Xiang et al., entitled "Semiconductor-on Insulator Transistor with Recessed Source and Drain" teach recessed source/drain regions as an approach to avoiding or reducing parasitic capacitance. Unfortunately, both Xiang et al. tolerates resistive extensions that connect the device channel to the recessed source/drain regions and that function similarly to LDD, adding series source/drain resistance. Yu teaches forming an ultra-thin channel on defined source/drain recesses and the FET gate between the source/drain recesses, two layer below. Since Yu aligns the gate to the source/drain recess, i.e., because Yu's devices are not self aligned, Yu produces FETs with a relatively wide process variation (i.e., channel length and source/drain overlap), which results in wider spread for circuit performance, i.e., deviation beyond a nominal design point by a significantly larger number of circuits/chips. Thus, previously, one was faced with accepting parasitic device capacitances, series channel resistances and/or looser design tolerances.

Thus, there is a need to reduce external resistance for ultra-thin SOI devices and while minimizing device on resistance.

SUMMARY OF INVENTION

It is a purpose of the invention to improve ultra-thin SOI performance;

It is another purpose of the invention to reduce ultra-thin SOI device external resistance;

It is yet another purpose of the invention to reduce external resistance in ultra-thin SOI devices without increasing device parasitic capacitance.

The present invention relates to a field effect transistor (FET), integrated circuit (IC) chip including the FETs and a method of forming the FETS. The devices have a thin channel, e.g., an ultra-thin (smaller than or equal to 10 nanometers (10 nm)) silicon on insulator (SOI) layer. Source/drain regions are located in recesses at either end of the thin channel and are substantially thicker (e.g., 30 nm) than the thin channel. Source/drain extensions and corresponding source/drain regions are self aligned to the FET gate and thin channel.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1A:
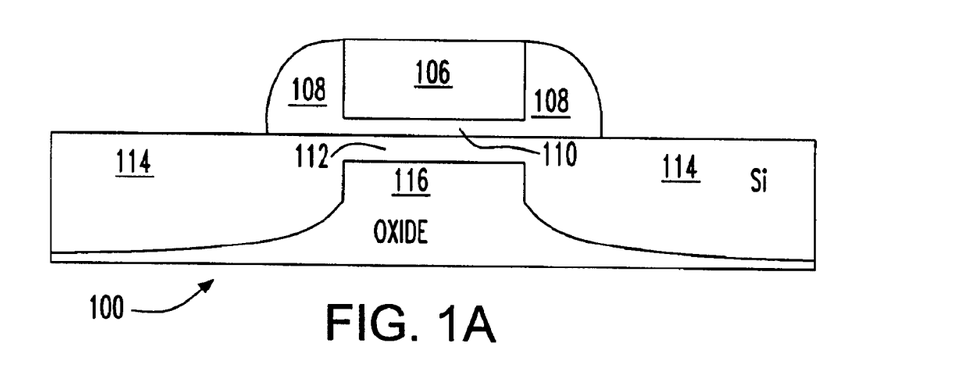
FIGS. 1A–C, each show an example of a preferred embodiment field effect transistor (FET) according to the present invention.
Figure 1B:
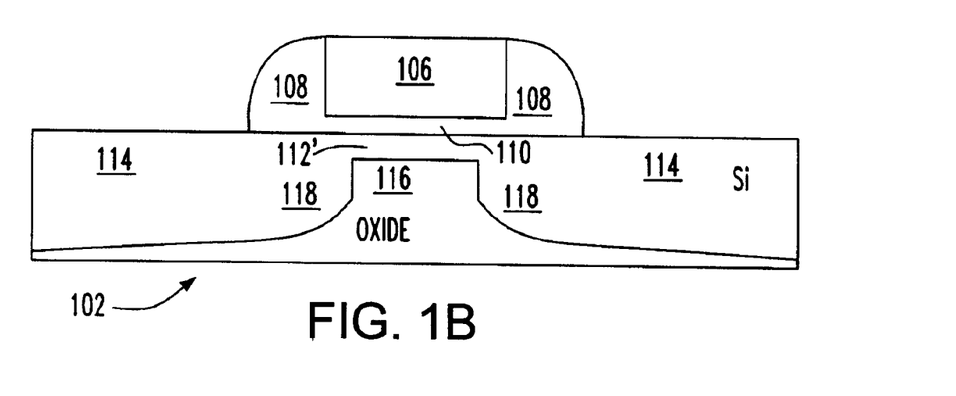
Figure 1C:
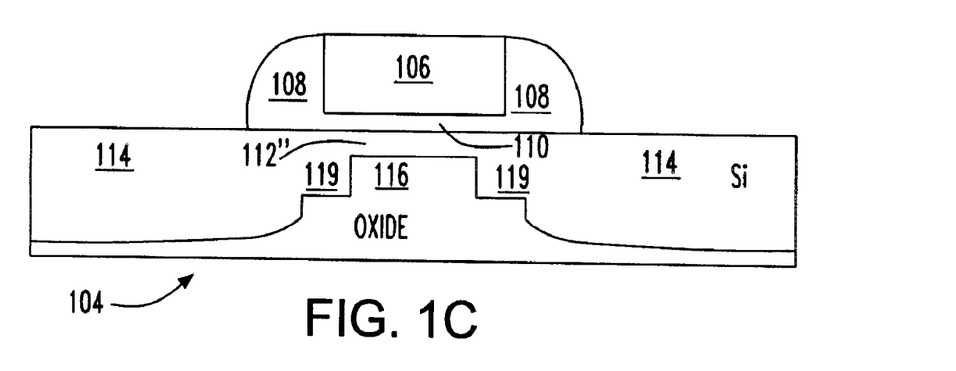

Turning now to the drawings and, more particularly, FIGS. 1A–C, each show an example of a field effect transistor (FET) 100, 102, 104 with self aligned recessed source/drain regions and extensions according to a preferred embodiment of the present invention with like elements labeled identically. In particular, FETs 100, 102, 104 may be typical devices in a circuit, such as a CMOS circuit on an ultra-thin (smaller than or equal to 15 nanometers (10 nm)) semiconductor on insulator (SOI) CMOS chip.

So, in the FET 100 example of FIG. 1A, a gate 106 has spacers 108 at each side. Preferably, the gate 106 is polysilicon, a metal, silicon-germanium (SiGe), a silicide or combination thereof and the spacers 108 are nitride. The gate 106 is on a gate dielectric layer 110 (e.g., oxide) above an ultra-thin channel 112, an ultra-thin semiconductor layer of strained silicon (SSi), Germanium (Ge), SiGe or, preferably, silicon (Si). The ultra-thin channel 112 is less than 40 nm long and, preferably, 2–3 times channel thickness or 30 nm. Recessed source/drain regions 114 are formed on both ends of the ultra-thin channel 112. The gate 106 has no appreciable direct overlap with the recessed source/drains (ESDs) 114, which have essentially uniform thickness. The source/drain regions 114 extend into the insulator (e.g., oxide) layer 116 at least 5 nm and, preferably 20–30 nm, below the ultra-thin silicon channel 112 for an overall source/drain thickness of 50 70 nm. In this embodiment, the extensions inherently form in either end of the channel 112, such that the device 100 is self aligned to the recessed source/drain regions 116 and extensions. The extensions operate to minimize short channel effect, so that high resistance lightly doped drains (LDD) regions are unnecessary and so, both device resistance and overlap capacitance minimized.

In the FET 102 example of FIG. 1B, self-aligned extensions 118 are formed at either end of the channel 112' where the gate 106 overlaps the source/drain recesses 114, which also has essentially uniform thickness, e.g., 50 70 nm. Again, since the gate 106 overlaps the self aligned extensions 118, series channel resistance is minimized. In the FET 104 example of FIG. 1C, self-aligned extensions 119 are also formed at either end of the channel 112" where the gate 106 overlaps the source/drain recesses 114'. However, in this example, but the source/drain recesses 114' have a non-uniform, stepped thickness, being slightly thinner at extensions 119.

Figure 2:
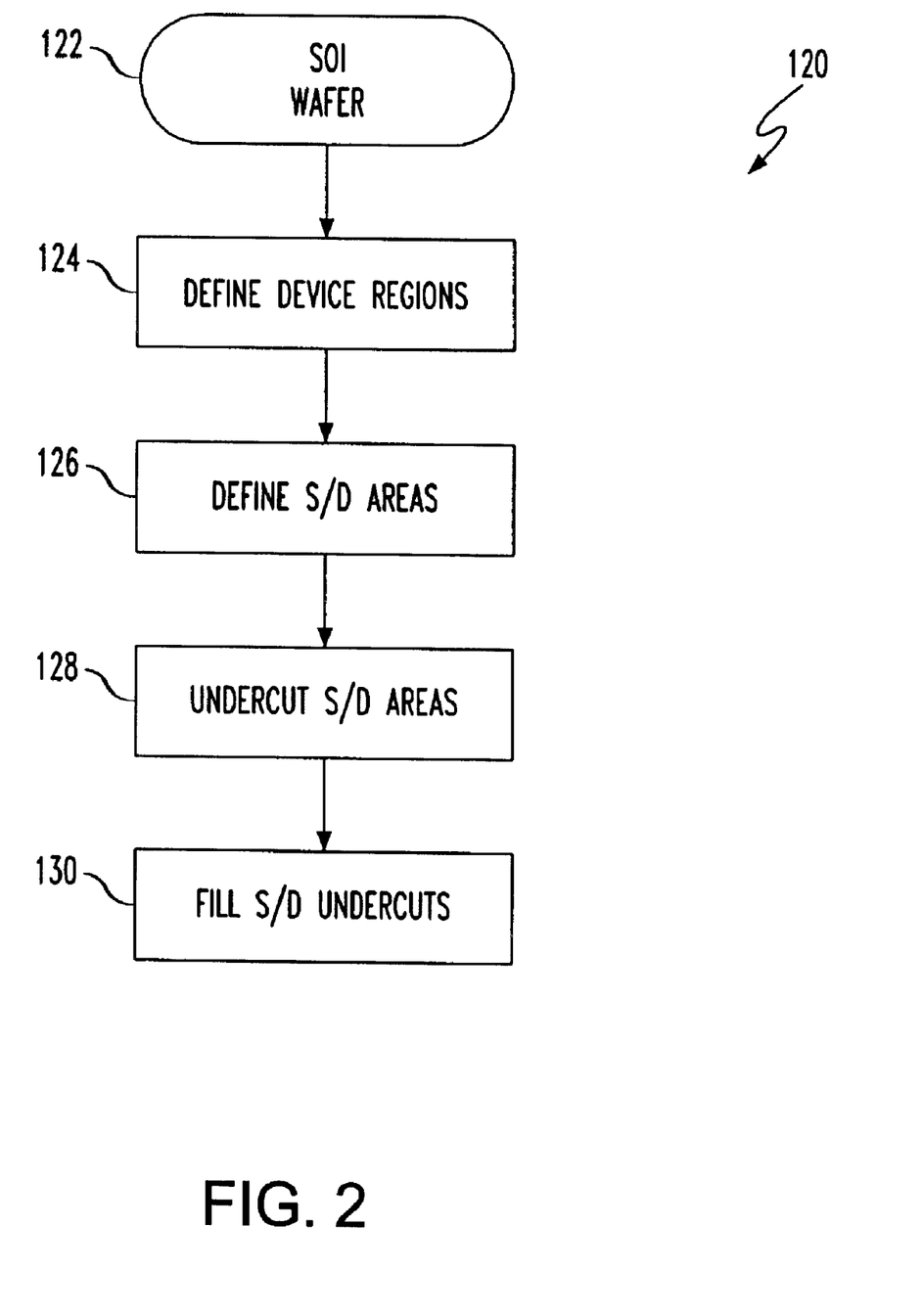
FIG. 2 shows a flow diagram example of steps for forming FETs with self aligned recessed extension and source/drain (ESD) areas on an ultra-thin SOI wafer according to a preferred embodiment of the present invention.

FIG. 2 shows in a flow diagram 120 an example of steps for forming self aligned FETs (e.g., 100) on an ultra-thin SOI wafer with recessed ESD areas 114 according to a preferred embodiment of the present invention. Beginning with a wafer 122, device regions are formed in step 124 to identify where devices located, e.g., patterning gates 106 at device regions and isolating device regions using shallow trench isolation (STI). Trenches extend through the thin silicon surface layer and into the underlying layers at least to the depth equal to the desired thickness of the ESDs 114 and preferably to an underlying semiconductor substrate. An isolating material, e.g., nitride is deposited to fill the trenches. The trench material holds the gate and the channel layer in place during subsequent processing steps. Next, in step 126 source/drain areas are defined for forming the ESDs 114. In step 128 the source/drain areas are undercut, opening orifices that extend into the underlying insulation layer 116. In step 130 source/drain areas 114 are filled with semiconductor material, e.g., silicon, and device fabrication continues normally, e.g., source/drain implant and diffusion, metallization and etc.

Figure 3:
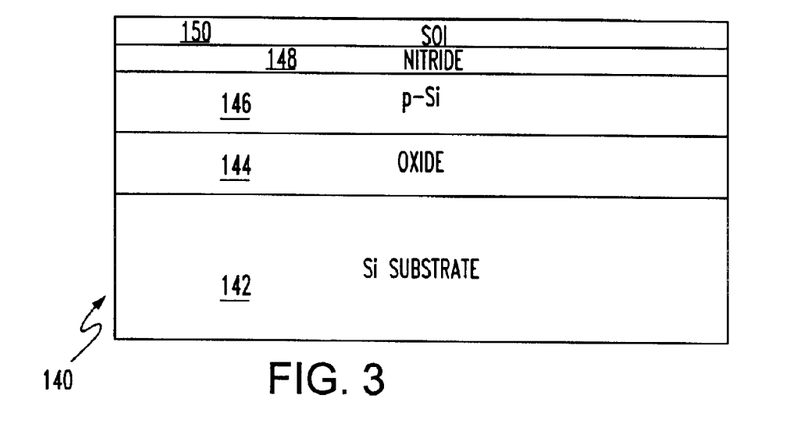
FIG. 3 shows cross section of an SOI bonded wafer.

FIGS. 3–7 show a first preferred embodiment method 140 of forming FETs with self aligned ESD areas on an ultra-thin SOI wafer, e.g., as provided in step 120 of FIG. 2. So, FIG. 3 shows the cross section of the SOI wafer 140 which is a bonded wafer with a semiconductor substrate 142, preferably silicon and may be SSi, Ge, SiGe, or strained silicon/silicon germanium (SSi/SiGe). An insulator layer 144 (preferably oxide) separates a sacrificial layer 146 (preferably a 50 nm layer of undoped silicon), from the semiconductor substrate 142. A thin insulator layer 148 (preferably, a 50 nm nitride layer) separates the ultra-thin channel layer 150 from the sacrificial layer 146.

Figure 4A:
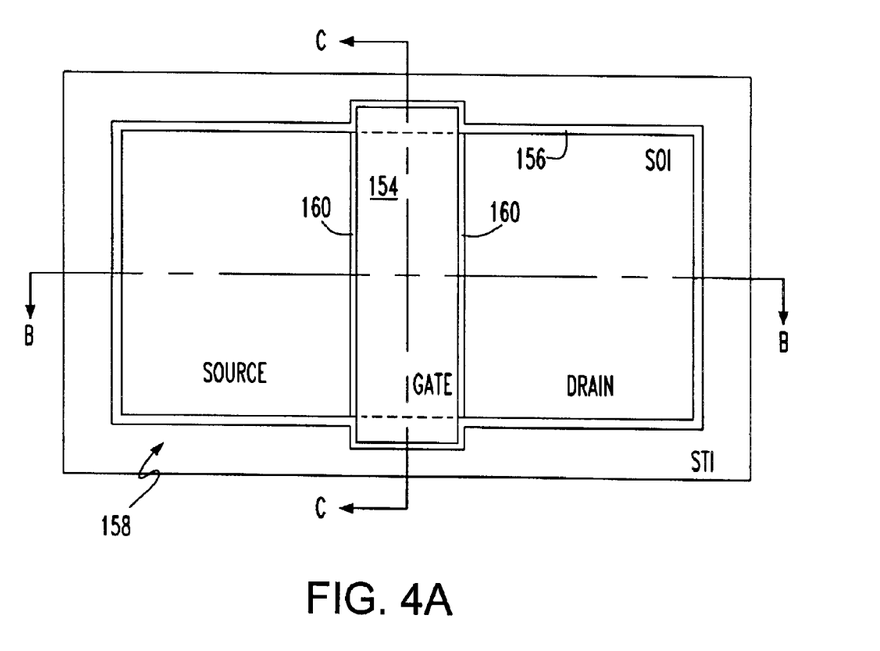
FIGS. 4A–C show an example of device definition step.
Figure 4B:
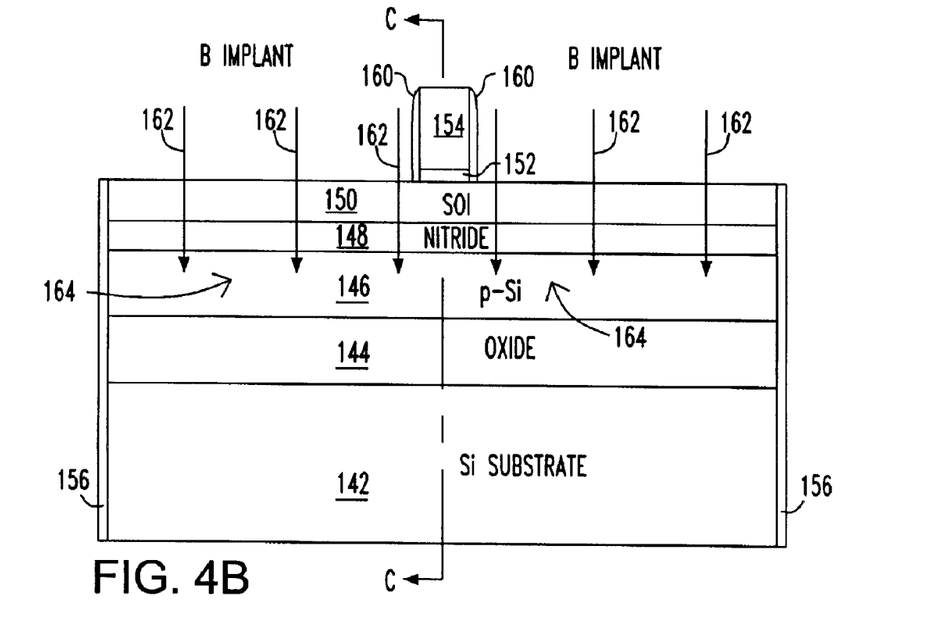
Figure 4C:
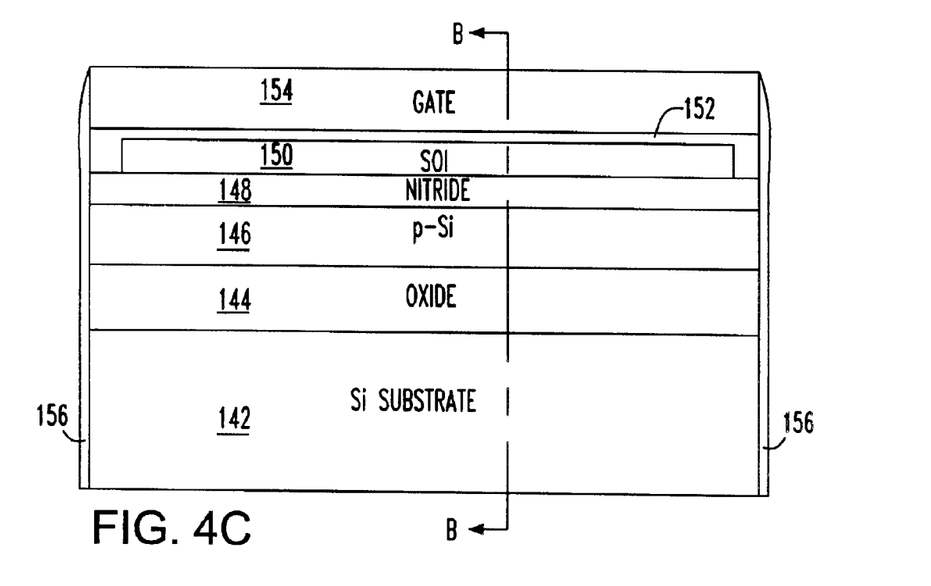

FIGS. 4A–C show an example of device definition step 124. FIG. 4A shows a plan view with cross sections through BB and CC shown in FIGS. 4B and 4C, respectively. So, a gate dielectric or oxide layer 152 is formed on the ultra-thin channel layer 150. The gate dielectric layer 152 may be an oxide, oxynitride or any suitable hi-K dielectric material layer and, for simplicity of discussion, is referred to herein as gate oxide. A conductive gate layer of metal, doped polysilicon, a silicide or combination thereof, is formed on the gate oxide layer 152. Then, the gate layer is patterned to define gates 154 using a suitable definition technique such as are well known in semiconductor manufacturing. Shallow trenches 156 are formed around the device perimeters, STI thereby defining device regions 158. Preferably, the STI trenches 156 are etched down through the ultra-thin channel layer 150, the thin insulating layer 148, the sacrificial layer 146 and the insulator layer 144 and etching into the silicon substrate layer 142. A thin insulator layer is formed over the gates 154 and filling the shallow trenches 156. The thin insulator layer is anisotropically etched to form spacers 160 alongside the gates 154 and with the STI trenches 156 still filled with insulator.

Finally, a dopant, represented by arrows 162, is implanted into the polysilicon gates 154. The implant dopes portions 164 of the sacrificial layer 146 at either side of the polysilicon gates 154. Preferably, the dopant 162 may be boron, preferably, implanted at 20 KeV/$10^{15}$ or, $BF_2$ implanted at 100 KeV/$10^{15}$. Then, the wafer is annealed (preferably at 900–1000° C. for 5–10 seconds) to activate the boron dopant in the sacrificial layer 146. Optionally, the dopant implant 162 may be done before forming thicker spacers 160 if thicker spacers 160 are necessary, e.g., to better the surface layer 150 from the sides when underlying material is removed in subsequent steps. A two step implant may be used to recess the source/drain regions 114 and extensions 118 of the FET 104 in FIG. 1C. First, prior to forming spacers 160, boron can be implanted at low energy, e.g., 7 KeV/($5*10^{14}$) or, $BF_2$ can be implanted at 35 KeV/($5*10^{14}$). Then, spacers 160 are formed and boron is implanted at a higher energy, e.g., 20 KeV/$10^{15}$ or, $BF_2$ can be implanted at 100 KeV/$10^{15}$.

Figure 5A:
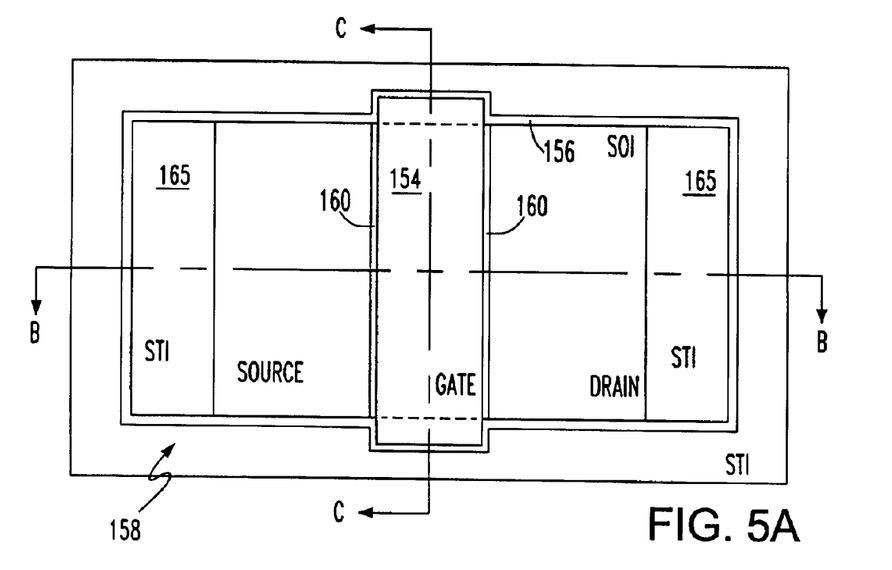
FIGS. 5A–C show an example of defining and sealing the ultra-thin channels before forming the recessed ESDs.
Figure 5B:
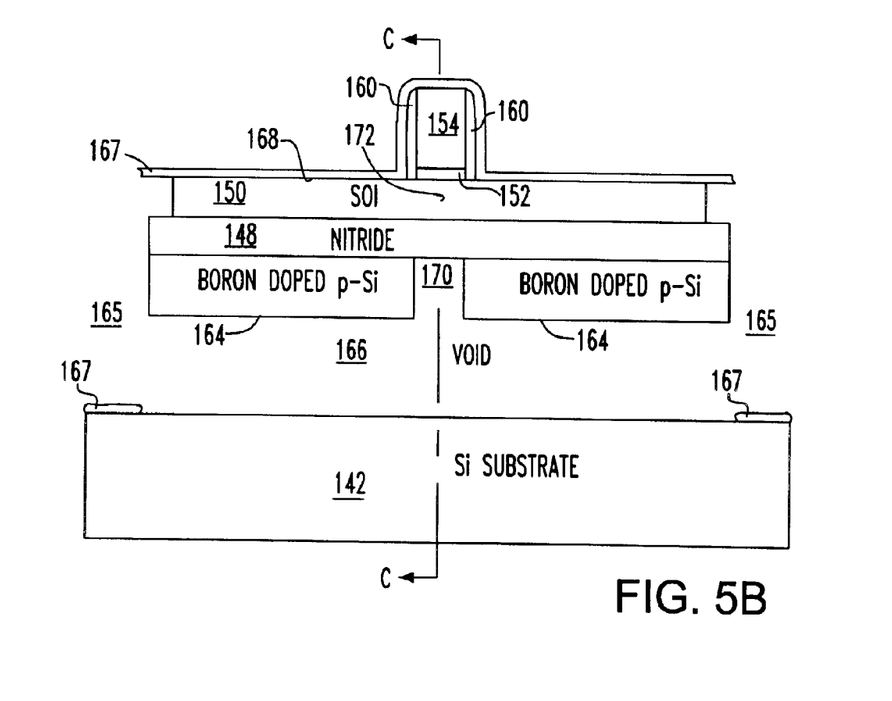
Figure 5C:
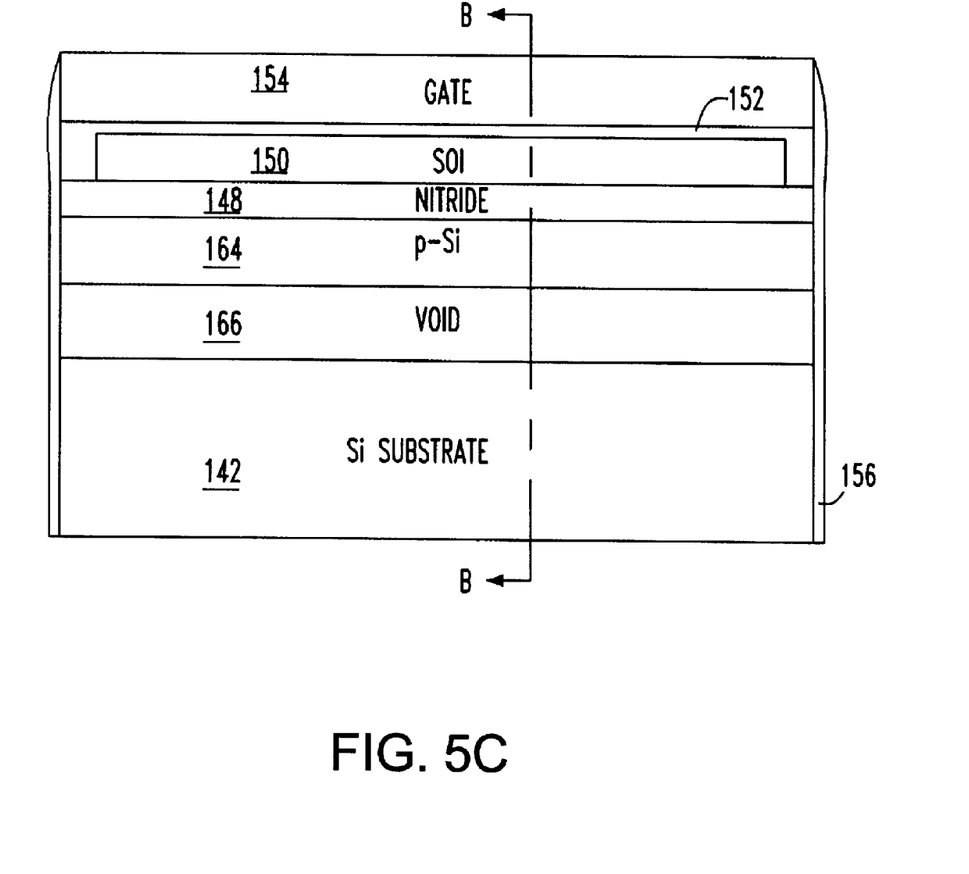

Next, FIGS. 5A–C show an example of the step 126 in FIG. 2 of defining the source/drain recess areas 164 and, as a result, the ultra-thin channels. FIG. 5A shows a plan view with cross sections through BB and CC shown in FIGS. 5B and 5C, respectively. First, using a selective etch, e.g., reactive-ion-etch (RIE), orifices 165 are opened at both ends of the device areas 158 through to the silicon substrate layer 142. Next, a wet etch is used to remove the oxide layer 144 under the sacrificial layer, which partially forms a void 166 below the sacrificial layer. A thin protective layer 167, preferably oxide, is directionally deposited on the upper wafer surface 168 to protect the ultra-thin layer 150. Using for example, high density plasma deposition (HDP), a thin oxide can be deposited only on the top of surface, leaving the bottom of layer 146 free of oxide. Then, the undoped portion of the sacrificial layer is selectively etched away forming a gap 170 between the doped portions 164. The undoped portion is etched using a selective etch with a much slower etch rate for boron doped silicon than for undoped material. Removing the undoped portion completes the void 166 and defines the channel 172 thereabove with source/drain areas defined by remaining sacrificial portions 164. The channel 172 is embedded in the ultra-thin channel layer 150 and contained from below by thin insulator layer 148 and from above by gate oxide 152. If the above described two step dopant was followed to dope the sacrificial layer 146, then, the cross-section of the doped portions 164, is substantially similar to the recessed source/drain regions 114 of FIG. 1C.

Figure 6A:
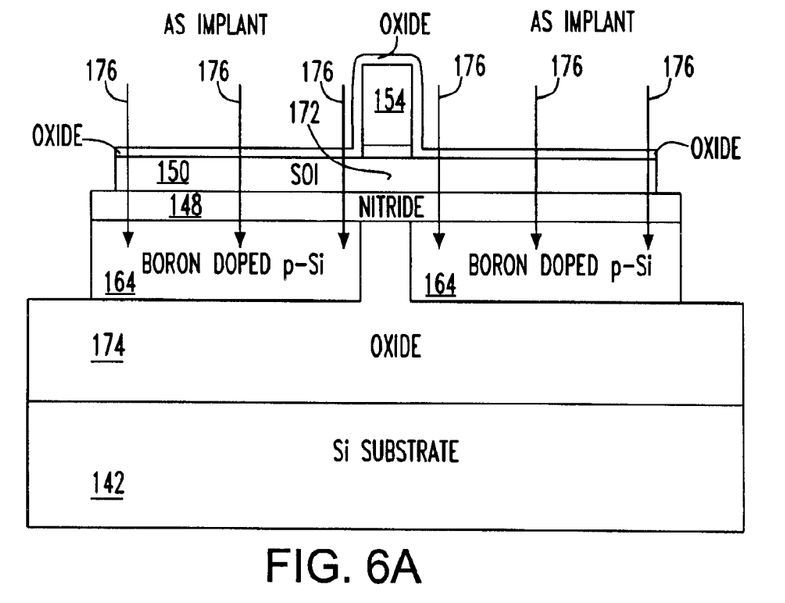
FIGS. 6A–B show an example of undercutting the ultra-thin layer for forming the recessed ESDs.
Figure 6B:
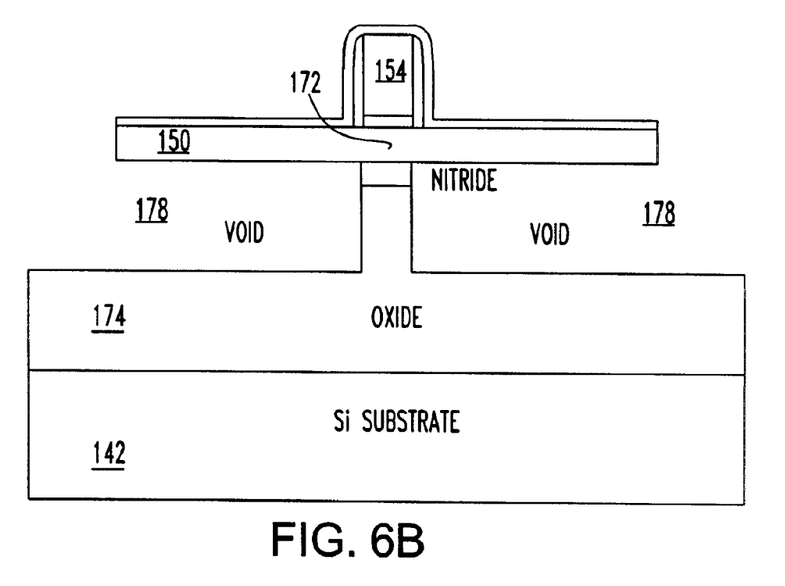

FIGS. 6A–B show an example of the step 128 in FIG. 2 of undercutting the source/drain areas for forming recessed ESDs. The void 168 is filled with a low-k material such as oxide 174 to reduce short channel effects. Then, any excess oxide is etched back, preferably to expose the sides of sacrificial layer portions 164. Next, arsenic, represented by arrows 176 is implanted into the sacrificial layer portions 164 at a dose sufficient that the sacrificial layer portions 164 are converted from p-type (p+) to n-type (n+). Another thin layer oxide 177 is directionally deposited using HDP to protect the polysilicon gate 154 and surface layer 150. The wafer is annealed to convert the p-type portions 164 to n-type, preferably, with a carrier concentration of at least $10^{20}$ per cubic centimeter ($cm^3$). Then, a selective wet etch with a faster etch rate for n-doped material than for undoped material is used to remove the n-type portions 164, partially forming a source/drain undercut 178 at each end of the channel 172. Optionally, oxide 174 is removed, slightly, to extend the source/drain voids 178 under either side of the gate 154 as in the example of FET 102 in FIG. 1B or FET 104 in FIG. 4C. Preferably, this is done by slightly changing the boron implant (162 in FIG. 4B) tilt angle, angling the boron inward towards both sides of the gate. Alternatively, however, oxide 174 may be etched slightly, although typically, it is harder to control etching, especially under a gate. Preferably, the wet etch also removes bonding layer 148 above the former location of n-type portions 164 to complete the source/drain undercuts 178. Alternately, however, the exposed (by removal of the n-type portions 164') portions of the bonding layer are removed with a suitable additional wet etch to complete the source/drain undercuts 178.

Figure 7:
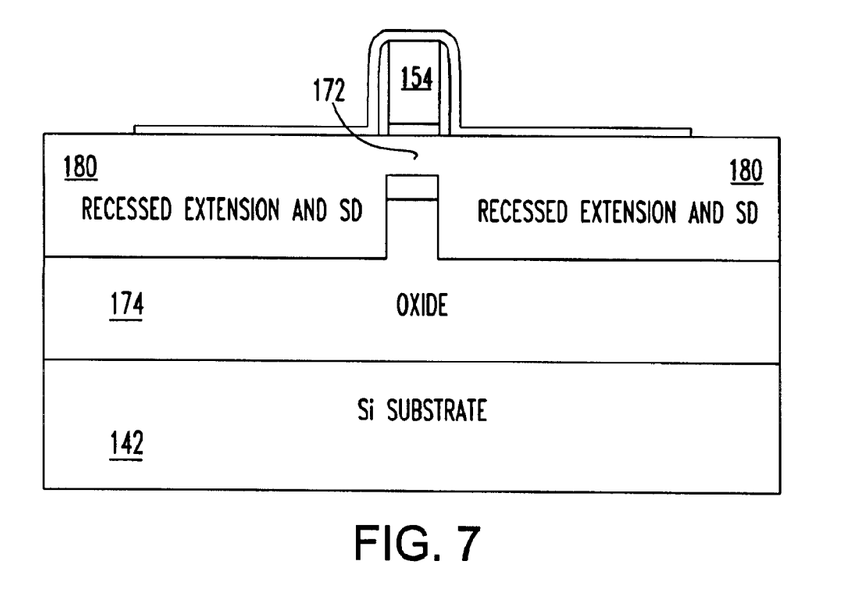
FIG. 7 shows an example of filling source/drain voids to form the recessed source/drain extensions.
Figure 8:
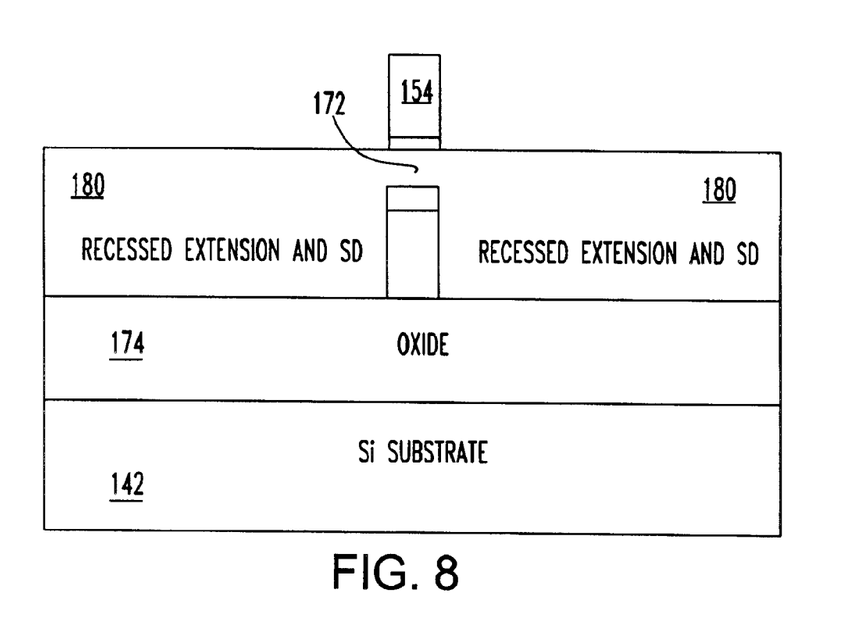
FIG. 8 shows removal of the remaining protective layer for subsequent typical semiconductor processing steps.

FIG. 7 shows an example of filling source/drain voids 178 to form the recessed source/drain extensions 180, step 130 in FIG. 2. Preferably, silicon is selectively epitaxially grown to fill the source/drain undercuts 178, thus forming a self aligned device with recessed source/drain and extension areas 180 at each end of the channel 172. In FIG. 8, after a wet etch is used strip away the remaining protective layer 167, completing the device for subsequent typical semiconductor processing steps, e.g., implanting n-type and p-type source/drain diffusion, metallization and etc.

Advantageously, a preferred embodiment FET is self aligned with external series resistance and parasitic capacitance minimized. Further, the present invention has application to ultra-thin SOI, as the ultra-thin surface silicon layer is thinned to 10 nm and beyond and as device channel lengths shrink below 40 nm. Also, the preferred device structure is such that the device operates with lower effective fields, which allows higher carrier mobility and, correspondingly, higher channel current. In addition, preferred embodiment ultra-thin SOI devices have improved short channel effect characteristics including a steeper sub-threshold current swing for improved performance. Further, preferred embodiment devices achieve this without the channel resistance and parasitic capacitance penalties incurred with prior art devices.

While the invention has been described in terms of preferred embodiments, those skilled in the art will recognize that the invention can be practiced with modification within the spirit and scope of the appended claims.

What is claimed is:

1. A field effect transistor (FET) comprising:
   a thin channel having a first thickness;
   a gate disposed above said thin channel;
   a source/drain region in a recess at each end of said thin channel and substantially thicker than said thin channel; and
   a source/drain extension between said thin channel and a corresponding said source/drain region, each said source/drain extension and said corresponding source/drain region being aligned to said gate and said thin channel.

2. A FET as in claim 1, wherein said recess extends under said gate at said each end.

3. A FET as in claim 1, wherein said recess partially extends under said gate at said each end.

4. A FET as in claim 1, wherein an upper surface of each said source/drain region is substantially coplanar with an upper surface of said thin channel.

5. A FET as in claim 1, wherein said thin channel is a semiconductor material selected from a group consisting of silicon (Si), Germanium (Ge), SiGe and strained silicon (SSi).

6. A FET as in claim 5, wherein said thin channel is strained silicon.

7. A FET as in claim 5, wherein said gate is made from a material comprising polysilicon.

8. A FET as in claim 5, wherein said gate is made from a material comprising a silicide.

9. A FET as in claim 1, wherein said thin channel is <15 nm thick.

10. A FET as in claim 9, wherein said thin channel is 10 nm thick.

11. A FET as in claim 9, wherein said thin channel is <40 nm long.

12. A FET as in claim 11, wherein said thin channel is 30 nm long.

13. A FET as in claim 9, wherein a lower surface of said recess is >5 nm below said thin channel.

14. A FET as in claim 13, wherein said lower surface is 40 nm below said thin channel.

15. A FET as in claim 1, wherein said FET is disposed on an insulating layer and said insulating layer is disposed on a semiconductor substrate.

16. A FET as in claim 15, wherein said semiconductor substrate comprises a silicon substrate.

17. A FET as in claim 15, wherein said semiconductor substrate comprises a strained silicon/silicon germanium (SSi/SiGe) substrate.

18. An integrated circuit (IC) on a silicon on insulator (SOI) chip, said IC including a plurality of field effect transistors (FETs) disposed on an insulating layer, said insulating layer being on a semiconductor substrate, each of said FETs comprising: a thin channel, said thin channel being a thin semiconductor layer and having a first thickness;
   a gate disposed above said thin channel;
   a source/drain region in a recess at each end of said thin channel and substantially thicker than said thin channel; and
   a source/drain extension between said thin channel and a corresponding said source/drain region, each said source/drain extension and said corresponding source/drain region being aligned to said gate and said thin channel.

19. An IC as in claim 18, wherein each said recess extends under a corresponding said gate at said either end.

20. An IC as in claim 18, wherein each said recess partially extends under a corresponding said gate at said either end.

21. An IC as in claim 18, wherein said thin semiconductor layer is a layer of material selected from a group consisting of silicon (Si), Germanium (Ge), SiGe and strained silicon.

22. An IC as in claim 21, wherein said thin channel is silicon and said gate is polysilicon.

23. An IC as in claim 22, wherein said thin channel is strained silicon.

24. An IC as in claim 22, wherein said thin channel is <15 nm thick.

25. An IC as in claim 24, wherein a lower surface of each said recess is >5 nm below said thin channel.

26. An IC as in claim 25, wherein said thin channel is <40 nm long.

27. An IC as in claim 26, wherein said semiconductor substrate is a silicon substrate.

28. An IC as in claim 27, wherein said semiconductor substrate is a strained silicon/silicon germanium (SSi/SiGe) substrate.

* * * * *